US008114480B2

(12) United States Patent
Baumann et al.

(10) Patent No.: US 8,114,480 B2
(45) Date of Patent: Feb. 14, 2012

(54) METHOD FOR SELF-LIMITING DEPOSITION OF ONE OR MORE MONOLAYERS

(75) Inventors: Peter Baumann, Aachen (DE); Johannes Lindner, Roetgen (DE)

(73) Assignee: Aixtron Inc., Sunnyvale, CA (US)

( * ) Notice: Subject to any disclaimer, the term of this patent is extended or adjusted under 35 U.S.C. 154(b) by 1011 days.

(21) Appl. No.: 11/763,231

(22) Filed: Jun. 14, 2007

(65) Prior Publication Data

US 2007/0293055 A1   Dec. 20, 2007

(30) Foreign Application Priority Data

Jun. 14, 2006 (DE) .................. 10 2006 027 932

(51) Int. Cl.
C23C 16/00 (2006.01)

(52) U.S. Cl. ............. 427/255.32; 427/248.1; 427/255.7; 427/255.28

(58) Field of Classification Search ................ 427/248.1
See application file for complete search history.

(56) References Cited

U.S. PATENT DOCUMENTS

| | | | |
|---|---|---|---|
| 5,090,985 A | 2/1992 | Soubeyrand et al. | |
| 6,086,947 A | 7/2000 | Clarke | |
| 6,086,957 A * | 7/2000 | Boyle et al. ................ | 427/376.2 |
| 6,090,442 A | 7/2000 | Klaus et al. | |
| 6,200,893 B1 | 3/2001 | Sneh | |
| 6,305,314 B1 | 10/2001 | Sneh et al. | |
| 6,451,119 B2 | 9/2002 | Sneh et al. | |
| 6,451,695 B2 | 9/2002 | Sneh | |
| 6,475,910 B1 | 11/2002 | Sneh | |
| 6,482,740 B2 * | 11/2002 | Soininen et al. ............. | 438/686 |
| 6,540,838 B2 | 4/2003 | Sneh et al. | |
| 6,541,067 B1 * | 4/2003 | Marsh et al. ................. | 427/252 |
| 6,602,784 B2 | 8/2003 | Sneh | |
| 6,605,735 B2 | 8/2003 | Kawano et al. | |
| 6,607,973 B1 | 8/2003 | Jeon | |
| 6,630,401 B2 | 10/2003 | Sneh | |
| 6,638,859 B2 | 10/2003 | Sneh et al. | |
| 6,638,862 B2 | 10/2003 | Sneh | |
| 6,824,816 B2 * | 11/2004 | Aaltonen et al. ............. | 427/124 |
| 6,984,591 B1 * | 1/2006 | Buchanan et al. ............ | 438/778 |
| 7,514,119 B2 * | 4/2009 | Ma et al. .................... | 427/255.31 |
| 2003/0203102 A1 | 10/2003 | Saito et al. | |
| 2004/0171210 A1 | 9/2004 | Shimamoto et al. | |
| 2006/0040510 A1 | 2/2006 | Lee et al. | |

FOREIGN PATENT DOCUMENTS

| | | |
|---|---|---|
| DE | 1553692 | 3/1976 |
| DE | 7831594 | 2/1979 |
| DE | 8703379 | 9/1987 |
| DE | 3917473 C2 | 10/1994 |
| DE | 19512402 A1 | 10/1996 |
| DE | 4104769 C2 | 8/1997 |
| DE | 10057491 A1 | 5/2002 |
| DE | 10212923 A1 | 1/2004 |
| DE | 10234735 A1 | 2/2004 |
| DE | 102004015174 A1 | 10/2005 |
| DE | 102004061094 A1 | 6/2006 |
| DE | 19880089 B4 | 4/2007 |
| EP | 0486455 A2 | 5/1992 |
| EP | 0997233 A2 | 5/2000 |
| EP | 0997232 B1 | 10/2002 |
| WO | 01/36702 A1 | 5/2001 |

OTHER PUBLICATIONS

Williams et al, Novel Mononuclear zirconium and hafnium alkoxides; improved precursors for the MOCVD of ZrO2 and HfO2, J. Mater. Chem., 2002, 12, pp. 165-167.*

Aixtron AG, Verfahren zum selbstlimitierenden Abscheiden ein oder mehrerer Monolagen sowie dazu geeignete Ausgangsstoffe, 15 pp, Dec. 15, 2004, Germany.

* cited by examiner

*Primary Examiner* — David Turocy
(74) *Attorney, Agent, or Firm* — SNR Denton US LLP

(57) ABSTRACT

The invention relates to a method for deposition of at least one layer containing at least one first component on at least one substrate in a process chamber, wherein first and second starting materials are introduced in gaseous form into the process chamber in alternation cyclically, at least the first starting material of which contains the first component, to deposit essentially only one layer of the first component in each cycle. To widen the spectrum of available starting materials suitable for the process, it is proposed that the first starting material shall consist of two β-diketones and one diene coordinated with one ruthenium atom, and a limiter shall be introduced into the process chamber simultaneously with or some time after the first starting material, such that deposition of the first component on the substrate is automatically concluded after the first layer is completed, wherein the limiter is or contains octane, butyl acetates, tetrahydrofuran, methanol, ethanol, isobutylamines, triethylamines, butanol, cyclohexane, isooctane, dioxane, dimethylformamide, pyridine and/or toluene.

14 Claims, No Drawings

METHOD FOR SELF-LIMITING DEPOSITION OF ONE OR MORE MONOLAYERS

CROSS REFERENCES TO RELATED APPLICATIONS

The present patent application claims priority benefit from German Application 102006027932.8 filed Jun. 14, 2006 which is herein incorporated by reference.

The invention relates to a method for deposition of at least one layer containing at least one first component on at least one substrate in a process chamber, wherein first and second starting materials, at least the first starting material of which contains the first component, are introduced in gaseous form into the process chamber in alternation cyclically to deposit essentially one layer, in particular a monolayer of the first component during each cycle.

The invention also relates to a starting material suitable for this purpose.

To guarantee further development of electronic components, e.g., for CMOS DRAM applications, there has been a search for high-k materials as alternatives to $SiO_2$ as the dielectric. Such candidates include aluminum oxide, hafnium oxide or praseodymium oxide, but especially multicomponent oxides are attracting particularly great attention because of their excellent properties with regard to the dielectric constant and leakage currents. Recent findings have even demonstrated improved material properties by laminating and/or blending these metal oxides with one another and/or improved thermal stability by admixture of silicon. Polysilicon must also be replaced by novel metal-based electrodes. For industrial fabrication of such material systems, a deposition technology that ensures an efficient and reproducible, uniform deposition of films with well-defined intermediate layers and a high conformality on structured substrates is required. MBE does not achieve conformal edge coverage in deposition of thin layers, whereas MOCVD and ALD methods guarantee good edge coverage in deposition on structured substrates.

In conventional MOCVD, there are inadequacies with regard to control of layer thickness, e.g., in deposition of nanolaminates, because of the poor atomic precision. In addition, inadequate edge coverage has been reported in deposition on highly structured substrates by conventional MOCVD.

ALD is a special form of MOCVD based in principle on alternating self-limiting chemical reactions to yield successive deposition of monolayers. A high conformality can be achieved in deposition on structured substrates. However, ALD methods rely on a very small number of available precursors, which are often based on chlorine compounds. By alternating introduction of gaseous $H_2O$, for example, as an oxidizing agent into the process chamber, HCl is obtained as a byproduct, which can be treated as an exhaust gas byproduct but is very difficult to handle in terms of safety technology. ALD processes are described in U.S. Pat. No. 6,482,740 B2, WO 01/36702 A1, U.S. Pat. No. 6,090,442 A and US 2006/0040510 A1 in particular.

Generic methods are described in U.S. Pat. Nos. 6,200,893, 6,451,695, 6,638,862, 6,602,784, 6,475,910, 6,630,401, 6,305,314, 6,451,119, 6,540,838 and U.S. Pat. No. 6,638,859 in particular.

DE 102 00 4015174 describes a method by which monolayers can be deposited by introducing a reactive starting material in alternation with a chemically reactive gas.

DE 102 12 923 A1 describes a method by which solid starting materials can be introduced into the gas phase and introduced as a gas into a process chamber.

DE 100 57 491 describes a method for vaporizing a substance in the form of a liquid by pulsed introduction into a heated gas volume.

U.S. Pat. No. 6,984,591 B1 describes an ALE [sic] method using starting materials containing a metal and having a complex structure. The starting materials may be deposited without any special limiters in the selected process parameters. The process is based on the starting materials used, so that layer growth ends automatically as soon as a layer has been deposited on the substrate. To facilitate handling of these starting materials, they are dissolved in hydrocarbons. Ruthenium is also mentioned there among a number of possible starting materials for consideration. The latter is also described in U.S. Pat. No. 6,824,816 B2.

U.S. Pat. No. 6,086,947 A, U.S. Pat. No. 6,605,735 B2 and US 2003/0203 1102 A1 describe the use of ruthenium β-diketones as a starting material.

U.S. Pat. No. 6,541,067 B1 describes a CVD method using ruthenium. U.S. Pat. No. 6,607,973 B1 describes a method for producing high-k dielectric layers. U.S. Pat. No. 5,090,985 describes a CVD method using organic starting materials. US 2004/0171210 A1 describes a CVD method for deposition of structured layers including the use of organic ruthenium compounds and an oxidizing gas. DE 102 34 735 A1 describes a method of vertical structuring of substrates by an ALD method.

Based on the prior art cited in the beginning, the object of the present invention is to enlarge the spectrum of available starting materials suitable for this process.

First and foremost, it is provided according to the present invention that the first starting material is a certain organometallic compound. Simultaneously with or some time after the first starting material, a limiter is introduced into the process chamber in such a way that deposition of the first component on the substrate ends automatically after the layer is completed. This makes it possible to perform the generic method with starting materials that cannot be deposited naturally in a self-limiting manner or only in a narrow process window. The spectrum of available starting materials is greatly expanded in this way. Substances that can be deposited in a self-limiting manner only within special narrowly limited process windows can also be deposited according to this invention even with process parameters in which the substances cannot be automatically deposited in a single layer on a substrate. A limiter is a hydrocarbon which cooperates with the first starting material or a component of the first starting material in such a way that the first starting material is deposited on the substrate only in a single layer, preferably as a monolayer. However, it is also provided that the limiter is not introduced into the process chamber together with the first starting material but instead is introduced during another process step. It may have a surface-passivating effect, so that the growth of the first component takes place merely in two dimensions. It is also possible to introduce the starting material together with a chemically reactive substance into the process chamber. The chemically reactive substance cooperates with the first component and/or with the limiter in such a way that a new monolayer of the first component can be deposited after conclusion of the cycle. It is thus possible to deposit a layer by cyclically depositing a monolayer on the previously deposited monolayer. The limiter has the function here of limiting the layer growth to one monolayer. In a refinement of the invention, the layer consists of several components, Here again, the individual components are introduced into the process chamber one after the other. However, it is also possible for multiple components to be introduced into the process chamber simultaneously, in which case measures are then also taken to limit the growth of the layer to one monolayer per cycle. With the limiter, the degree of deposition can be controlled. This is accomplished in particular in the growth of a single-component or multicomponent layer on a planar and/or highly structured substrate. Multiple substrates may be arranged in the process chamber. They may be situated side by side or layered one above the other. The substrates may be aligned in parallel with one another. However, they may also be inclined at an angle to one another. Three different substances are preferably used: a first starting material containing the first component, a limiter and a reactive gas. These substances are introduced into the process chamber in succession in cyclic sequence so that only one monolayer is deposited during each cycle. The process chamber can be flushed with an inert gas between the individual process steps and/or process cycles. The process chamber may be evacuated between the individual process steps or process cycles. The limiters are preferably hydrocarbons. The pairing of ruthenium and octane or isooctane as a limiter is preferred. The process temperature may be between 200° C. and 700° C. However, it may also be only between 200° C. and 500° C. The pressure inside the process chamber is below 100 mbar and is preferably in the range between 0.1 mmHg and 10 mmHg. However, the pressure may also vary only within a range of 1 to 3 mmHg. Several starting materials may also be used, wherein each starting material contains a second or a third component, said components being incorporated into the layer so that a multicomponent layer or layer sequence is deposited. The starting materials may be in the form of solids or liquids. They may be converted to the gas phase in special vaporization chambers. It may be kept on hand there in solution with the limiter. It may also be an at least 0.01 molar solution of the substance in a solvent. It may be a 0.05 to 0.1 molar solution in particular. Oxygen compounds and/or nitrogen compounds may be considered as chemically reactive gases, in particular $O_2$, $O_3$, $N_2O$, $H_2O$ or $NH_3$. They are vaporized in a special vaporization chamber in which there is a heated carrier gas. The liquid starting material is atomized into this heated gas. The heat required for vaporization is withdrawn from the gas phase. Vaporization thus takes place in a contact-free process. The deposited layers may contain metal, oxygen, nitrogen or carbon. These are preferably insulating, passivating, semiconducting or electrically conducting layers. A plurality of layers is preferably deposited one above the other, each layer being produced by depositing monolayer on monolayer.

It is essential that by adding at least one limiter to the deposition process, new limiting precursor systems are created. It is possible in particular for precursors that are not self-limiting without limiters or are inadequately self-limiting to be rendered self-limiting. Many limiters may also have a stronger self-limiting effect on a deposition process than other limiters. The degree of self-limiting deposition may also depend on the concentration of at least one limiter. In particular a minimum concentration of a limiter may be necessary to achieve self-limiting deposition. The number of precursor systems available for self-limiting deposition can thus be increased. This allows flexibility in deposition of layers.

The deposition may include a contact-free vaporization system and method using noncontinuous injection of liquid metallic starting substances (precursors) or those mixed with limiters into a heated volume with subsequent conversion to the gas phase. In the deposition system, the precursors may therefore be made available to the deposition process with a high level of gas phase separation. This can increase the growth rate and throughput. Or a few precursors or precursors mixed with limiters can be supplied to the deposition process through a continuous vaporization system and method or a system and method based on bubblers or a gas supply system and method. On the whole, the precursors can be supplied through one or more precursor supply systems and methods. The precursors and limiters may be vaporized jointly or separately. If the precursors and limiters are vaporized separately, the precursors and limiters may be combined in the gas phase.

In one example, ruthenium or ruthenium oxide layers were deposited. To do so, an organometallic ruthenium precursor was mixed in case 1) with octane, butyl acetates, tetrahydrofuran, methanol, ethanol, isobutylamines, triethylamines, butanol and/or cyclohexane and in another case 2) the organometallic ruthenium precursor was mixed with isooctane, dioxane, dimethylformamide, pyridine and/or toluene. In each case the mixture was vaporized and introduced into a reactor chamber alternately and at a separate time from gas containing reactive oxygen to permit deposition of ruthenium or ruthenium oxide layers on a substrate. In experiments, the amount of available precursor mixture was increased or decreased by certain factors. In case 1) the thickness of the deposited film was increased or decreased accordingly. In case 2) the thickness of the deposited film remained constant. The solvents in cases 1) and 2) control the degree of self-limiting deposition. With the solvents in case 2), self-limiting deposition may be accomplished, e.g., with the organometallic ruthenium precursor. The organometallic precursors may consist of two β-diketones and a diene coordinated with one ruthenium atom. The β-diketone may be 2,2,6,6-tetramethyl-3,5-heptanedionato and the diene may be 1,5-cyclooctadiene.

When using isooctane, dioxane, dimethylformamide or toluene, essentially ruthenium was deposited with alternating introduction of the vaporized precursor mixture and the gas containing reactive oxygen into a reactor chamber at separate times. However, essentially ruthenium oxide was deposited when pyridine was used under these conditions.

When using isooctane, dioxane and/or dimethylformamide, essentially ruthenium oxide was deposited with non-pulsed continuous and simultaneous introduction of the gas containing reactive oxygen into the vaporized precursor mixture into a reactor chamber. However, essentially ruthenium was deposited when toluene was used under these conditions.

In another example, the deposition of zirconium oxide or hafnium oxide layers was investigated. To do so, in a case 1) an organometallic zirconium or hafnium precursor was combined with octane, butyl acetates, tetrahydrofuran, methanol, ethanol, isobutylamines, triethylamines, butanol and/or cyclohexane and in another case 2) with isooctane, dioxane, dimethylformamide, pyridine and/or toluene. In each case the mixture was vaporized and introduced into a reactor chamber in alternation with gas containing reactive oxygen and at a separate point in time to allow deposition of zirconium oxide or hafnium oxide layers on a substrate. In experiments, the amount of available precursor mixture was increased or decreased by certain factors. In case 1) the thickness of the deposited film was increased or decreased accordingly. Self-limiting behavior was achieved only in an inadequate narrow process window at average temperature of approximately 300-360° C. (for Hf), approximately 280-350° C. (for Zr) and average precursor mixture pulse lengths of approximately 0.8-1.2 s. In case 2) the thickness of the deposited film remained essentially constant even significantly above or below these ranges. The solvents in cases 1) and 2) control the degree of self-limiting deposition. With the solvents in case 2), self-limiting deposition can be achieved, e.g., with the organometallic zirconium or hafnium precursor. The organometallic precursors may consist of two tert-butoxide and two 1-methoxy-2-methyl-2-propanolate groups coordinated with one zirconium or hafnium atom or four 1-methoxy-2-methyl-2-propanolate groups coordinated with one zirconium or hafnium atom.

All the features disclosed here are (independently) essential to the invention. The disclosure of the present patent application therefore also incorporates the disclosure content of the respective/attached priority documents (photocopy of the previous patent application) to the full extent, also for the purpose of including the features of these documents in claims in the present patent application.

The invention claimed is:

1. A method for depositing at least one layer containing at least one first component on at least one substrate in a process chamber, wherein first and second starting materials are introduced in gaseous form in alternation cyclically into the process chamber, the first starting material comprises two β-diketones and one diene coordinated with a ruthenium atom, the first starting material of which contains the first component and the second starting material of which contains reactive oxygen, said method characterized in that simultaneously with or at some time after the first starting material is introduced into the process chamber, a limiter A is introduced into the process under chamber process parameters in which the first component cannot be deposited by self-limiting deposition in a single layer on the substrate, wherein the limiter A contains at least one of the following substances: octane, butyl acetates, tetrahydrofuran, methanol, ethanol, isobutylamines, triethylamines, butanol and cyclohexane;

thereafter keeping the process parameters the same except for replacing the limiter A by a different limiter B thereby to deposit the first component in a single layer in a self-limiting deposition fashion, wherein the limiter B contains at least one of the following substances: isooctane, dioxane, dimethylformamide, pyridine and toluene.

2. A method according to claim 1, characterized in that the β-diketone is a 2,2,6,6-tetramethyl-3,5-heptanedionato.

3. A method according to claim 2, characterized in that the diene is a 1,5-cyclooctadiene.

4. A method according to claim 1, characterized in that a gas containing reactive oxygen and a mixture of a vaporized ruthenium starting material and isooctane, dioxane, dimethylformamide and/or toluene are introduced in alternation and at separate times into the process chamber to deposit ruthenium.

5. A method according to claim 1, characterized in that a gas containing reactive oxygen and a mixture of a vaporized ruthenium starting material and pyridine are introduced in alternation and at separate times into the process chamber to deposit ruthenium oxide.

6. A method for depositing at least one layer containing at least one first component on at least one substrate in a process chamber, wherein first and second starting materials are introduced cyclically and in alternation into the process chamber, the first starting material consists of two tert-butoxide and two 1-methoxy-2-methyl-2-propanolate groups coordinated with a zirconium or hafnium atom, first starting material of which contains the first component, and the second starting material of which contains reactive oxygen said method characterized in that simultaneously with or some time after the first starting material is introduced into the process chamber, a limiter A is introduced into the process chamber under process parameters in which the first component cannot be deposited by self-limiting deposition in a single layer on the substrate, wherein the limiter A contains at least one of the following substances: octane, butyl acetates, tetrahydrofuran, methanol, ethanol, isobutylamines, triethylamines, butanol and cyclohexane;

thereafter keeping the process parameters the same except for replacing the limiter A by a different limiter B thereby to deposit the first component in a single layer in a self-limiting deposition fashion wherein the limiter B contains at least one of the following substances: isooctane, dioxane, dimethylformamide, pyridine and toluene.

7. A method according to claim 6, characterized in that the first starting material is vaporized together with either the limiter A or the limiter B as a mixture and is introduced into a reactor chamber in alternation with and some time after the second starting material in order to deposit zirconium oxide or hafnium oxide layers on the substrate.

8. The method according to 7, wherein the first and second starting materials are vaporized in a vaporization chamber with a heated carrier gas and are converted to a gas phase by uptake of heat from the heated carrier gas.

9. A method for depositing at least one layer containing at least one first component on at least one substrate in a process chamber, wherein first and second starting materials are introduced in gaseous form cyclically and in alteration into the process chamber, the first starting material comprises two β-diketones and one diene coordinated with a ruthenium atom, the first starting material of which contains the first component and the second starting material of which contains reactive oxygen, said method characterized in that simultaneously with or at some time after the first starting material is introduced into the process chamber, a limiter B1 is introduced in gaseous form into the process chamber under process parameters in which ruthenium is deposited by self-limiting deposition in a single layer on the substrate, wherein the limiter B1 contains at least one of the following substances: isooctane, dioxane, dimethylformamide and toluene;

thereafter keeping the process parameters the same except for replacing the limiter B1 by a different limiter containing pyridine thereby to deposit ruthenium oxide in a single layer in a self-limiting deposition fashion.

10. A method for depositing at least one layer containing at least one first component on at least one substrate in a process chamber, wherein first and second starting materials are introduced in gaseous form cyclically and in alteration into the process chamber, the first starting material comprises two β-diketones and one diene coordinated with a ruthenium atom, the first starting material of which contains the first component and the second starting material of which contains reactive oxygen, said method characterized in that simultaneously with or at some time after the first starting material is introduced into the process chamber, a limiter containing pyridine is introduced in gaseous form into the process chamber under process parameters in which ruthenium oxide is deposited by self-limiting deposition in a single layer on the substrate;

thereafter keeping the process parameters the same except for replacing the limiter containing pyridine by a different limiter B1 thereby to deposit ruthenium in a single layer in a self-limiting deposition fashion, wherein the limiter B1 contains at least one of the following substances: isooctane, dioxane, dimethylformamide and toluene.

11. A method for depositing at least one layer containing at least one first component on at least one substrate in a process chamber, wherein first and second starting materials are introduced in gaseous form continuously and simultaneously into the process chamber, the first starting material comprises two β-diketones and one diene coordinated with a ruthenium atom, the first starting material of which contains the first component and the second starting material of which contains reactive oxygen, said method characterized in that simultaneously with the first and second starting materials, a limiter B2 is introduced in gaseous form into the process chamber under process parameters in which ruthenium oxide is deposited by non-self-limiting deposition in a single layer on the substrate, wherein the limiter B2 contains at least one of the following substances: isooctane, dioxane and dimethylformamide;

thereafter keeping the process parameters the same except for replacing the limiter B2 by a limiter containing toluene thereby to deposit ruthenium in a single layer in a non-self-limiting deposition fashion.

12. A method for depositing at least one layer containing at least one first component on at least one substrate in a process chamber, wherein first and second starting materials are introduced in gaseous form continuously and simultaneously into the process chamber, the first starting material comprises two β-diketones and one diene coordinated with a ruthenium atom, the first starting material of which contains the first component and the second starting material of which contains reactive oxygen, said method characterized in that simultaneously with the first and second starting materials, a limiter containing toluene is introduced in gaseous form into the process chamber under process parameters in which ruthenium is deposited by non-self-limiting deposition in a single layer on the substrate;

thereafter keeping the process parameters the same except for replacing the limiter containing toluene by a different limiter B2 to deposit ruthenium oxide in a single layer in a non-self-limiting deposition fashion, wherein the limiter B2 contains at least one of the following substances: isooctane, dioxane and dimethylformamide.

13. A method for depositing at least one layer containing at least one first component on at least one substrate in a process chamber, wherein first and second starting materials are introduced in gaseous form in alternation cyclically into the process chamber, the first starting material comprises two β-diketones and one diene coordinated with a ruthenium atom, the first starting material of which contains the first component and the second starting material of which contains reactive oxygen, said method characterized in that simultaneously with or at some time after the first starting material is introduced into the process chamber, a limiter B is introduced into the process chamber under process parameters in which the first component is deposited by self-limiting deposition in a single layer on the substrate, wherein the limiter B contains at least one of the following substances: isooctane, dioxane, dimethylformamide, pyridine and toluene;

thereafter keeping the process parameters the same except for replacing the limiter B by a different limiter A thereby to deposit the first component in a single layer in a non-self-limiting deposition fashion, wherein the limiter A contains at least one of the following substances: octane, butyl acetates, tetrahydrofuran, methanol, ethanol, isobutylamines, triethylamines, butanol and cyclohexane.

14. A method for depositing at least one layer containing at least one first component on at least one substrate in a process chamber, wherein first and second starting materials are introduced cyclically and in alternation into the process chamber, the first starting material consists of two tert-butoxide and two 1-methoxy-2-methyl-2-propanolate groups coordinated with a zirconium or hafnium atom, the first starting material of which contains the first component, and the second starting material of which contains reactive oxygen, said method characterized in that simultaneously with or some time after the first starting material is introduced into the process chamber, a limiter B is introduced into the process chamber under process parameters in which the first component is deposited by self-limiting deposition in a single layer on the substrate, wherein the limiter B contains at least one of the following substances: isooctane, dioxane, dimethylformamide, pyridine and toluene;

thereafter keeping the process parameters the same except for replacing the limiter B by a different limiter A thereby to deposit the first component in a single layer in a non-self-limiting deposition fashion, wherein the limiter A contains at least one of the following substances: octane, butyl acetates, tetrahydrofuran, methanol, ethanol, isobutylamines, triethylamines, butanol and cyclohexane.

* * * * *